US009847292B2

(12) United States Patent
Chang et al.

(10) Patent No.: US 9,847,292 B2
(45) Date of Patent: Dec. 19, 2017

(54) ELECTRICAL ISOLATOR PACKAGING STRUCTURE AND MANUFACTURING METHOD FOR ELECTRICAL ISOLATOR

(71) Applicant: Industrial Technology Research Institute, Hsinchu (TW)

(72) Inventors: Yuan-Tai Chang, New Taipei (TW); Kai-Cheung Juang, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 14/973,728

(22) Filed: Dec. 18, 2015

(65) Prior Publication Data

US 2017/0125343 A1    May 4, 2017

(30) Foreign Application Priority Data

Nov. 4, 2015 (TW) .............................. 104136245 A

(51) Int. Cl.
| | |
|---|---|
| *H01L 43/04* | (2006.01) |
| *H01L 23/522* | (2006.01) |
| *H01F 27/28* | (2006.01) |
| *H01F 41/04* | (2006.01) |
| *H01L 27/22* | (2006.01) |
| *H01L 49/02* | (2006.01) |

(52) U.S. Cl.
CPC ..... *H01L 23/5227* (2013.01); *H01F 27/2804* (2013.01); *H01F 41/041* (2013.01); *H01L 27/22* (2013.01); *H01L 28/10* (2013.01); *H01L 43/04* (2013.01); *H01F 2027/2809* (2013.01)

(58) Field of Classification Search
CPC .......... H01L 43/06; H01L 43/08; H01L 43/10
See application file for complete search history.

(56) References Cited

U.S. PATENT DOCUMENTS

| | | | |
|---|---|---|---|
| 4,801,883 A | 1/1989 | Muller et al. | |
| 4,863,806 A | 9/1989 | Merrick et al. | |
| 4,980,568 A | 12/1990 | Merrick et al. | |
| 5,148,243 A | 9/1992 | Merrick et al. | |
| 5,500,912 A | 3/1996 | Alonas et al. | |

(Continued)

FOREIGN PATENT DOCUMENTS

| | | |
|---|---|---|
| CN | 200979983 | 11/2007 |
| CN | 102620031 | 8/2012 |

(Continued)

OTHER PUBLICATIONS

Office Action of Taiwan Counterpart Application, dated Aug. 29, 2016, p. 1-p. 8, in which the listed references were cited.

(Continued)

*Primary Examiner* — Cuong Q Nguyen
(74) *Attorney, Agent, or Firm* — JCIPRNET

(57) ABSTRACT

An electrical isolator packaging structure and a manufacturing method of an electrical isolator are provided. The electrical isolator packaging structure includes a first substrate, a second substrate, a coil, and a magnetic field (MF) sensor. The coil is disposed on the first substrate. The MF sensor is disposed on the second substrate. The position of the coil is arranged according to the position of the MF sensor such that the coil transmits a signal to the MF sensor. Thus, the electrical isolator can be implemented by magnetic coupling with the coil and the MF sensor.

13 Claims, 5 Drawing Sheets

(56) References Cited

U.S. PATENT DOCUMENTS

| | | | |
|---|---|---|---|
| 5,751,009 | A | 5/1998 | Anderson et al. |
| 6,087,882 | A | 7/2000 | Chen et al. |
| 7,179,383 | B1 * | 2/2007 | Porter .................. G01F 1/708 210/222 |
| 7,545,059 | B2 | 6/2009 | Chen et al. |
| 7,818,890 | B2 | 10/2010 | Duric et al. |
| 7,920,010 | B2 | 4/2011 | Chen, Jr. et al. |
| 8,064,972 | B2 | 11/2011 | McLoone et al. |
| 8,076,793 | B2 | 12/2011 | Robbins |
| 8,169,108 | B2 | 5/2012 | Dupuis et al. |
| 8,385,043 | B2 | 2/2013 | Ng et al. |
| 8,390,093 | B1 | 3/2013 | Hopper et al. |
| 8,400,748 | B2 | 3/2013 | Yamamoto et al. |
| 8,451,032 | B2 | 5/2013 | Dong et al. |
| 8,592,944 | B2 | 11/2013 | Santangelo et al. |
| 8,736,343 | B2 | 5/2014 | Chen et al. |
| 8,878,591 | B2 | 11/2014 | Fang et al. |
| 9,019,057 | B2 | 4/2015 | Fouquet et al. |
| 2004/0021544 | A1 | 2/2004 | Wan |
| 2008/0030080 | A1 * | 2/2008 | Chen .................. H01L 23/60 307/91 |
| 2011/0199073 | A1 | 8/2011 | Myers et al. |
| 2014/0268917 | A1 | 9/2014 | Ma et al. |
| 2014/0333295 | A1 | 11/2014 | Fernandez et al. |
| 2015/0022193 | A1 | 1/2015 | Burdette et al. |
| 2015/0041190 | A1 | 2/2015 | Bonifield et al. |
| 2015/0340872 | A1 | 11/2015 | Franzon et al. |
| 2017/0125343 | A1 | 5/2017 | Chang et al. |

FOREIGN PATENT DOCUMENTS

| | | |
|---|---|---|
| CN | 104269425 | 1/2015 |
| TW | 535000 | 6/2003 |
| TW | 201122753 | 7/2011 |
| TW | 201304401 | 1/2013 |
| WO | 2007029435 | 3/2007 |
| WO | 2010101222 | 9/2010 |
| WO | 2010137090 | 12/2010 |

OTHER PUBLICATIONS

Shunichi Kaeriyama, et al., "A 2.5 kV Isolation 35 kV/us CMR 250 Mbps Digital Isolator in Standard CMOS With a Small Transformer Driving Technique," IEEE Journal of Solid-State Circuits, vol. 47, No. 2, Feb. 2012, pp. 435-443.

M. Münzer, et al., "Coreless transformer a new technology for half bridge driver IC's," International Exhibition and Conference for Power Electronics Intelligent Motion Power Quality (PCIM), May 2003, pp. 1-4.

John R. Long, "Monolithic Transformers for Silicon RF IC Design," IEEE Journal of Solid-State Circuits, vol. 35, No. 9, Sep. 2000, pp. 1368-1382.

Shunichi Kaeriyama, et al., "A 2.5kV isolation 35kV/us CMR 250Mbps 0.13mA/Mbps Digital Isolator in Standard CMOS with an on-chip small transformer," 2010 IEEE Symposium on VLSI Circuits (VLSIC), Jun. 16-18, 2010, pp. 197-198.

Mark Cantrell, "Recommendations for Control of Radiated Emissions with isoPower Devices," ADI: Application Note (AN-0971), Rev. C, retrieved on Mar. 2015, pp. 1-20.

Silicon Labs, "5 KV LED Emulator Input, 4.0 a Isolated Gate Drivers," Si826x Data Sheet, retrieved on Mar. 2015, pp. 1-40.

Avago Technologies, "2.5 Amp Gate Drive Optocoupler with Integrated (VCE) Desaturation Detection and Fault Status Feedback," HCPL-316J Data Sheet, Mar. 9, 2015, pp. 1-32.

MACOM Technology Solutions, "Transformer, 1:1 Flux Coupled Transformer 0.3 to 200 MHz," MABA-010112-CT1A40 Data Sheet, retrieved on Mar. 2015, pp. 1- 4.

Office Action of Taiwan Related Application No. 105101495, dated Jul. 1, 2016, p. 1-p. 5, in which the listed references were cited.

Office Action of Japan Related Application, application No. 2016090143, dated Jun. 20, 2017, p. 1-p. 6, in which the listed references (US application No.1 & foreign patent No. 1-3) were cited.

Office Action of Japan Counterpart Application, dated Jun. 20, 2017, p. 1-p. 5, in which the listed references Foreign patent No. 1-2) were cited.

"Office Action of U.S. Related Application, U.S. Appl. No. 15/047,641", dated Sep. 22, 2017, pp. 1-22, in which the listed references were cited.

\* cited by examiner

ELECTRICAL ISOLATOR PACKAGING STRUCTURE AND MANUFACTURING METHOD FOR ELECTRICAL ISOLATOR

CROSS-REFERENCE TO RELATED APPLICATION

This application claims the priority benefit of Taiwan application serial no. 104136245, filed on Nov. 4, 2015. The entirety of the above-mentioned patent application is hereby incorporated by reference herein and made a part of this specification.

TECHNICAL FIELD

The disclosure relates to a signal transmission technique and particularly relates to an electrical isolator packaging structure and a manufacturing method of an electrical isolator.

BACKGROUND

In the field of signal transmission, often there is need to transmit a signal or energy from a circuit of one voltage domain to a circuit of another voltage domain, or from one medium to another medium. Due to the difference in voltage domain or medium, the signal may interfere with or cause breakdown in the peripheral circuits by the parasitic path during the transmission and result in damage. Considering the reliability of the circuits, electrical isolators, couplers, or isolation barriers are usually adopted for transmitting signals between the circuits of different voltage domains, so as to protect the circuits.

Electrical isolators are applicable to many fields of power supply circuits, such as power supply systems (e.g., power supplies, motor control systems, server power supply systems, and home appliances), illumination control systems (e.g., LED controllers), industrial motor systems (e.g., robotic arms and car motors), and so on. The aforementioned power supply circuit systems usually generate signals or orders through a control circuit, so as to control the output stage circuit and transmit the energy to the load.

Currently, electrical isolators are usually implemented by using optical couplers, capacitors, or transformers. In the case of using an optical coupler as the electrical isolator, the manufacturing process of LED is not compatible with the transistor manufacturing process (e.g., CMOS manufacturing process) and LED has issues such as light decay and heat loss. Therefore, LED cannot be integrated into the chip and additional packaging is required. Nevertheless, if a transformer or capacitor, which can be integrated into the chip, is used as the electrical isolator, transmission of high frequency signals may be needed in order to achieve efficient transmission. As a result, the circuit equipped with such an electrical isolator will require additional modulation and demodulation functions for signal transmission. Thus, how to implement an electrical isolator that can lower power consumption and reduce signal distortion remains an issue that needs to be addressed.

SUMMARY

The disclosure provides an electrical isolator packaging structure and a manufacturing method of an electrical isolator, which implement the functions of an electrical isolator by magnetic coupling with a coil and a magnetic field (MF) sensor.

According to an embodiment of the disclosure, the electrical isolator packaging structure includes a first substrate, a second substrate, a coil, and a MF sensor. The coil is disposed on the first substrate. The MF sensor is disposed on the second substrate. The position of the coil is arranged according to the position of the MF sensor such that the coil transmits a signal to the MF sensor.

According to an embodiment of the disclosure, the manufacturing method of the electrical isolator includes the following steps. A coil is disposed on a first substrate. Further, a MF sensor is disposed on a second substrate, and the position of the coil is arranged according to the position of the MF sensor, such that the coil transmits a signal to the MF sensor.

Based on the above, the electrical isolator packaging structure described in the embodiments of the disclosure utilizes the coil and the MF sensor to implement the functions of the electrical isolator by magnetic coupling. The electrical isolator in the embodiments of the disclosure may be combined with a chip manufacturing process, and the transmitted signal may be a high frequency signal or a low frequency signal and do not need to be modulated or demodulated. Accordingly, the electrical isolator implemented with the coil and the MF sensor in the embodiments of the disclosure lowers the power consumption and reduces signal distortion.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
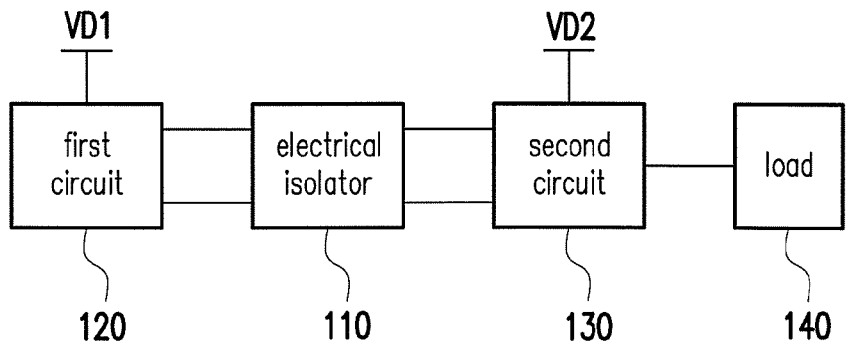
FIG. 1 is a diagram showing a circuit with an electrical isolator according to an embodiment of the disclosure.

FIG. 1 is a diagram showing a circuit 100 with an electrical isolator 110 according to an embodiment of the disclosure. The circuit 100 includes the electrical isolator 110, a first circuit 120, a second circuit 130, and a load 140. A power supply of the first circuit 120 is connected to a first voltage domain VD1 and a power supply of the second circuit 130 is connected to a second voltage domain VD2.

The first circuit 120 may be an input stage circuit or a control circuit while the second circuit 130 may be an output stage circuit. The load 140 is connected to an output end of the second circuit 130.

In this embodiment, the first voltage domain VD1 and the second voltage domain VD2 may be different. The circuit 100 is applicable to a power supply circuit system. Therefore, the second voltage domain VD2 may be 20V to 35 kV depending on the power supply circuit system that is used. The first voltage domain VD1 is a voltage range commonly used for the control circuit, such as 1.25V, 3.3V, 5V, and so on. In addition, according to different applications of the power supply circuit system, the load 140 may be a power supply, illumination equipment, a motor, a home appliance, a robotic aim, a car motor, and so on. Nevertheless, the embodiment of the disclosure is not limited to the aforementioned.

Figure 2:
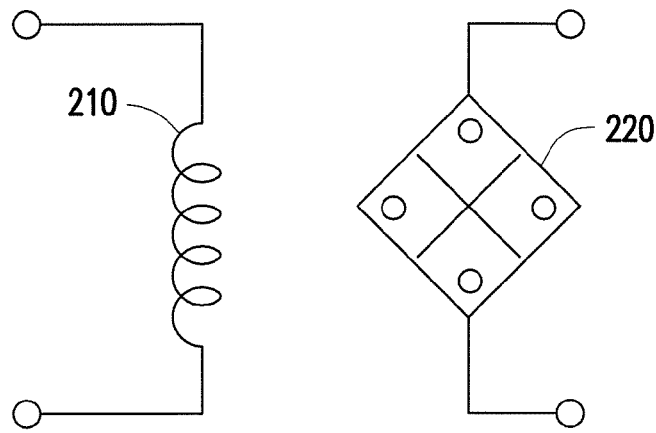
FIG. 2 is a circuit diagram of an electrical isolator according to an embodiment of the disclosure.

FIG. 2 is a circuit diagram of the electrical isolator 110 according to an embodiment of the disclosure. With reference to FIG. 2, the electrical isolator 110 includes a coil 210 and a magnetic field (MF) sensor 220. In this embodiment, the MF sensor 220 is implemented by a Hall sensor (or called a Hall device), for example. Two ends of the coil 210 are connected to a current generator controlled by the control circuit, and a current generated by the current generator flows in the coil 210 to generate a magnetic field (MF) signal. Accordingly, the electrical isolator 110 emits the MF signal by the coil 210 and the MF signal is received by the MF sensor 220 and converted to a voltage signal to be transmitted to a rear circuit, so as to achieve the function of electrical isolation or electrical coupling. It is known from an experiment that the MF signal and the voltage signal generated by the MF sensor 220 have a wide operating frequency range (for example, the MF signal and the voltage signal may operate at a frequency of 100 kHz to 2 MHz) and therefore are suitable for low frequency or high frequency signal transmission as required.

Since the coil 210 and the MF sensor 220 may both be implemented by a semiconductor manufacturing process, it is easy to integrate them into a chip without additionally packaging the electrical isolator 110. Thus, the manufacturing cost and packaging cost are reduced. If a currently available transformer or capacitor is used to implement the electrical isolator, it is usually required to use modulator and demodulator for modulating and demodulating the signal during signal transmission, so as to carry out the transmission properly. However, the modulation and demodulation are likely to slightly distort the signal waveform. In contrast thereto, the electrical isolator 110 of this embodiment of the disclosure directly uses the control signal (e.g., PWM signal), which the first circuit 120 inputs to the electrical isolator in FIG. 1, and causes the coil 210 in FIG. 2 to generate the MF signal by a current encoder and the current generator without using the modulator and demodulator, such that the MF sensor 220 directly obtains the content of the control signal through the MF signal without the operations of modulating and demodulating the signal, thereby preventing signal distortion. In other words, the electrical isolator 110 of this embodiment of the disclosure does not need to perform signal modulation and demodulation. Therefore, power consumption is lowered and signal distortion is reduced. Moreover, the electrical isolator packaging structure described in the embodiment of the disclosure does not need to be provided with a module for noise filtering. And, loop delay does not occur and the operating speed of the circuit and the stability of the circuit loop are enhanced correspondingly.

Figure 3:
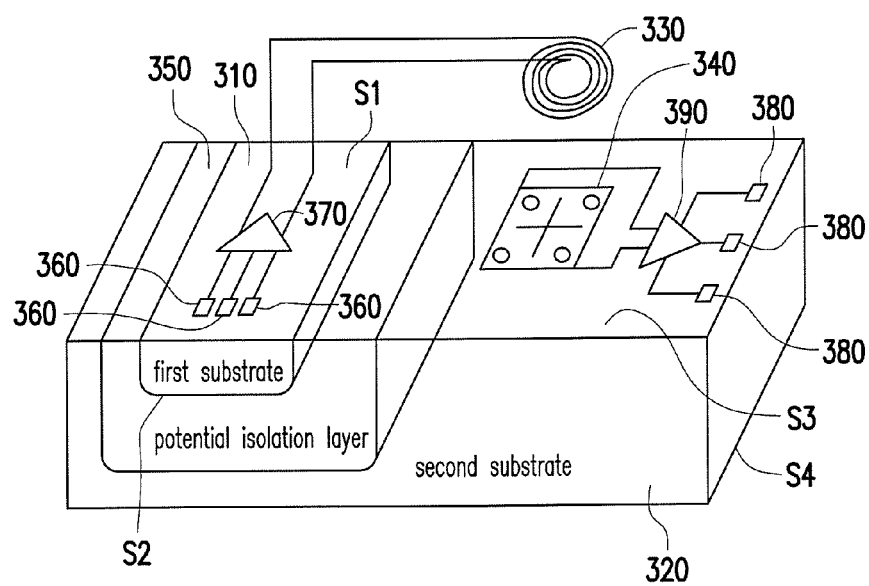
FIG. 3 is a diagram showing an electrical isolator packaging structure according to the first embodiment of the disclosure.

FIG. 3 is a diagram showing an electrical isolator packaging structure 300 according to the first embodiment of the disclosure. FIG. 3 illustrates an example that the electrical isolator packaging structure 300 is implemented by a single chip. The electrical isolator packaging structure 300 mainly includes a first substrate 310, a second substrate 320, a coil 330, and a MF sensor 340. The first substrate 310 and the second substrate 320 may be P-type silicon substrates. In this embodiment, the second substrate 320 serves as a chip substrate and the first substrate 310 is disposed in the second substrate 320 through a potential isolation layer 350. The first substrate 310 has a first surface S1 and a second surface S2 which is opposite to the first surface S1. The second substrate 320 has a third surface S3 and a fourth surface S4 which is opposite to the third surface S3. The position of the coil 330 is arranged according to the position of the MF sensor 340, such that the coil 330 transmits a signal to the MF sensor 340. In order to implement the electrical isolator packaging structure 300 on a single chip, the potential isolation layer 350 is disposed between the first substrate 310 and the second substrate 320, so as to isolate the potentials of the first substrate 310 and the second substrate 320.

The first substrate 310 and the coil 330 are described in detail hereinafter. In addition to the coil 330, the first surface S1 of the first substrate 310 further has a plurality of first pads 360 and an input amplifier 370 thereon. However, it should be noted that the disclosure is not limited thereto. The position of the coil 330 may be arranged according to the position of the MF sensor 340. An input end of the input amplifier 370 is coupled to an input stage circuit via a plurality of first pads 360 and wires. In other words, the input stage circuit is coupled to the input end of the input amplifier 370 via the wire and the first pads 360, so as to transmit an input signal to the input amplifier 370. An output end of the input amplifier 370 is connected to two ends of the coil 330, such that the coil 330 uses the input signal transmitted by the input amplifier 370 to transmit the MF signal to the MF sensor 340 on the third surface S3 of the second substrate 320 by magnetic field coupling. In this embodiment, the position of the coil 330 is above the MF sensor 340, and an isolation layer that does not interfere with the MF signal is disposed between the coil 330 and the MF sensor 340. In other embodiments, the position of the coil 330 may be under or on two sides of the MF sensor 340, so as to transmit the MF signal of the coil 330 to the MF sensor 340.

The second substrate 320 and the MF sensor 340 are described in detail hereinafter. In addition to the MF sensor 340, the third surface S3 of the second substrate 320 further has a plurality of second pads 380 and an output amplifier 390 thereon. A receiving end of the output amplifier 390 is coupled to an output end of the MF sensor 340, and an output end of the output amplifier 390 is connected to the second pads 380. In other words, the MF sensor 340 is electrically connected to the second pads 380 via the output amplifier 390. An output stage circuit is coupled to the second pads 380 via a wire. Accordingly, when the MF sensor 340 receives the MF signal, the MF sensor 340 converts the MF signal to an output signal and provides the output signal to the output amplifier 390. In this embodiment, the output signal here is a voltage signal. After the output amplifier 390 amplifies the output signal, the output signal of the output amplifier 390 is transmitted to the output stage circuit via the wire and the second pads 380. Accordingly, the output stage circuit provides the energy or signal to the load coupled to the output end of the output stage circuit by the output signal.

Figure 4:
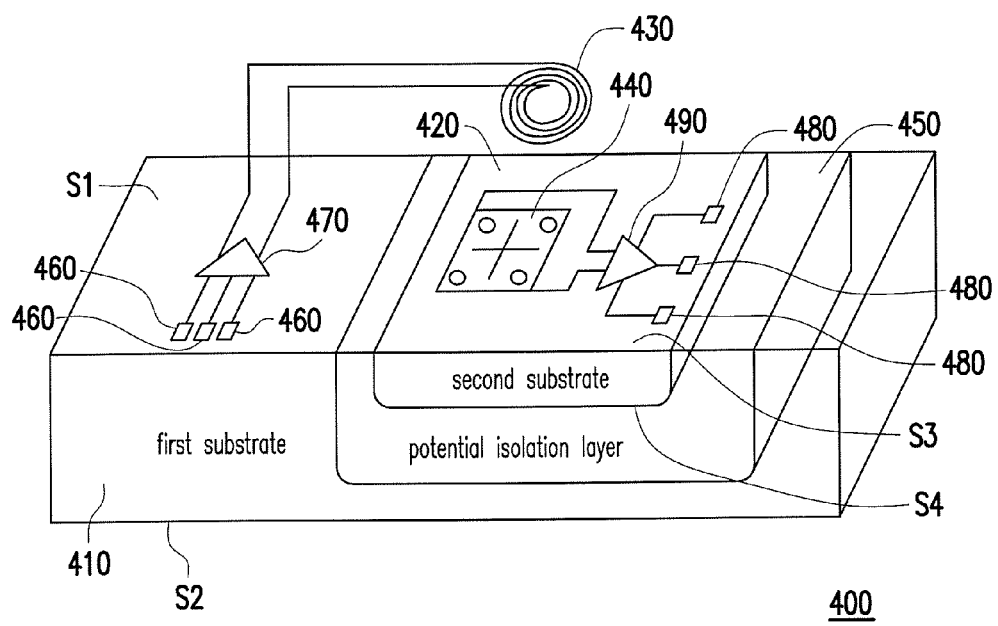
FIG. 4 is a diagram showing an electrical isolator packaging structure according to the second embodiment of the disclosure.

FIG. 4 is a diagram showing an electrical isolator packaging structure 400 according to the second embodiment of the disclosure. A difference between FIG. 4 and FIG. 3 is that, in the embodiment of FIG. 4, a first substrate 410 serves as the chip substrate and a second substrate 420 is disposed in the first substrate 410 through a potential isolation layer 450. A coil 430, a MF sensor 440, first pads 460, an input amplifier 470, second pads 480, and an output amplifier 490 in FIG. 4 are similar to the coil 330, the MF sensor 340, the first pads 360, the input amplifier 370, the second pads 380, and the output amplifier 390 in FIG. 3.

Figure 5A:
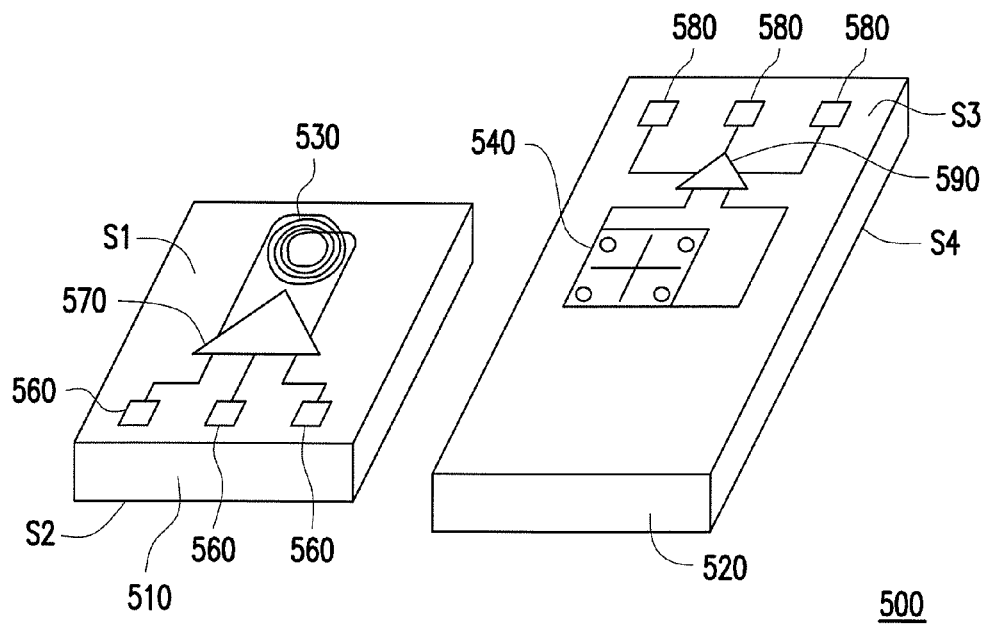
FIG. 5A and FIG. 5B are diagrams showing an electrical isolator packaging structure according to the third embodiment of the disclosure.
Figure 5B:
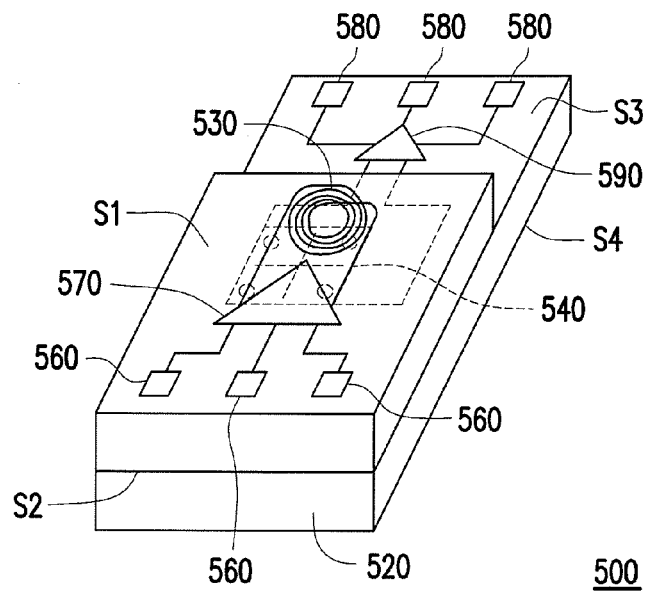

FIG. 5A and FIG. 5B are diagrams showing an electrical isolator packaging structure 500 according to the third embodiment of the disclosure. FIG. 5A and FIG. 5B illustrate an example that the electrical isolator packaging structure 500 is implemented by two chips. The electrical isolator packaging structure 500 mainly includes a first substrate 510, a second substrate 520, a coil 530, and a MF sensor 540. The first substrate 510 includes a first surface S1 and a corresponding second surface S2 while the second substrate 520 includes a third surface S3 and a corresponding fourth surface S4. The first substrate 510 and the second substrate 520 belong to different chips. In this embodiment, the first surface S1 of the first substrate 510 has the coil 530, a plurality of first pads 560, and an input amplifier 570 disposed thereon. The third surface S3 of the second substrate 520 has the MF sensor 540, a plurality of second pads 580, and an output amplifier 590 disposed thereon. After the two substrates 510 and 520 are disposed (as shown in FIG. 5A), in this embodiment, the second surface S2 of the first substrate 510 is disposed above the third surface S3 of the second substrate 520 (as shown in FIG. 5B) and the position of the coil 530 is arranged right above the MF sensor 540, so as to minimize a distance between the coil 530 and the MF sensor 540. Accordingly, the coil 530 is able to transmit a MF signal to the MF sensor 540. The coil 530, the MF sensor 540, the first pads 560, the input amplifier 570, the second pads 580, and the output amplifier 590 in FIG. 5A and FIG. 5B are similar to the components having the same names in FIG. 3 and FIG. 4. Thus, details thereof are not repeated hereinafter. In some embodiments, the position of the coil 530 may be under or on two sides of the MF sensor 540. For example, the first substrate 510 may be disposed under the second substrate 520. It should be noted that the arrangement/positions of the aforementioned components are not limited to the disclosure of FIG. 5A and FIG. 5B and may be adjusted as appropriate.

Figure 6A:
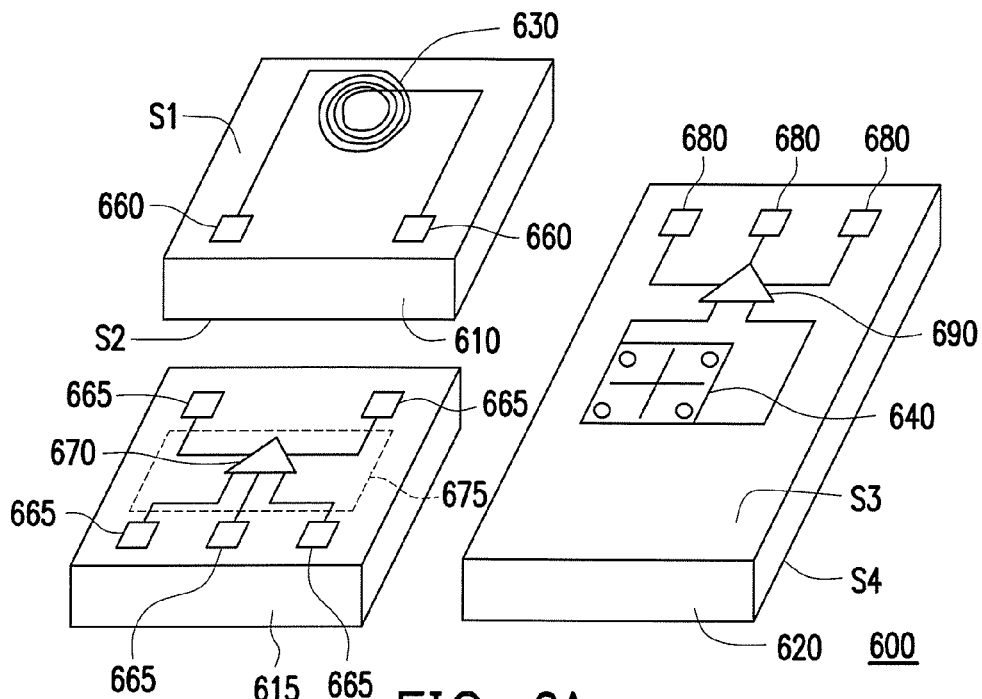
FIG. 6A and FIG. 6B are diagrams showing an electrical isolator packaging structure according to the fourth embodiment of the disclosure.
Figure 6B:
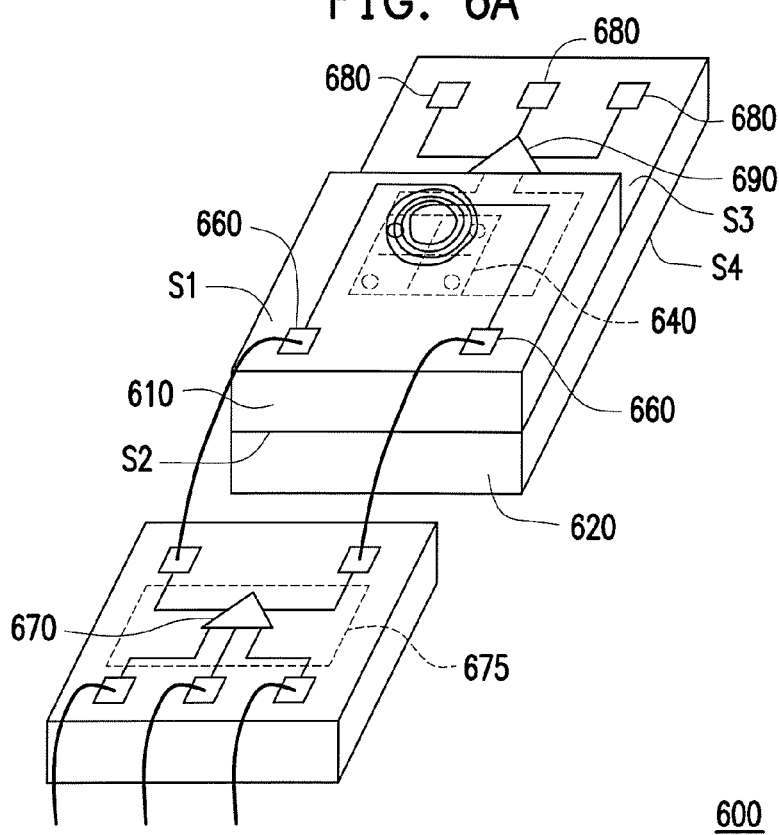

FIG. 6A and FIG. 6B are diagrams showing an electrical isolator packaging structure 600 according to the fourth embodiment of the disclosure. FIG. 6A and FIG. 6B illustrate an example that the electrical isolator packaging structure 600 is implemented by three or more chips. A difference between FIG. 6A to FIG. 6B and FIG. 5A to FIG. 5B is that, in addition to a first substrate 610 and a second substrate 620, the electrical isolator packaging structure 600 in FIG. 6 further includes a third substrate 615. In other words, the first substrate 610, the second substrate 620, and the third substrate 615 may belong to different chips. In this embodiment, the first surface S1 of the first substrate 610 only has a coil 630 and a plurality of first pads 660 thereon. The first pads 660 and two ends of the coil 630 are electrically connected with each other. An input amplifier 670 is not disposed on the first substrate 610 but disposed on the third substrate 615.

It should be noted that a control circuit 675 may also be disposed on the third substrate 615, so as to use a chip with the third substrate 615 as a control chip. Specifically, in this embodiment of the disclosure, the input amplifier 670 is integrated into the control circuit 675 and the control circuit 675 is electrically connected to a plurality of third pads 665 in the third substrate 615 to be coupled to the coil 630. The coil 630 is connected to the first pads 660 on the first surface S1 of the first substrate 610. The control circuit 675 is electrically connected to the coil 630 via the third pads 665 in the third substrate 615, the first pads 660 in the first substrate 610, and the wire therein. The control circuit 675 may also be connected to the circuits on other chips via the third pads 665 to achieve corresponding functions. In this embodiment, the control circuit 675 further includes the input amplifier 670, a current encoder, and a current generator. The current encoder receives the control signal and converts the control signal into a current by the current generator, so as to generate the MF signal. The coil 630, the MF sensor 640, the first pads 660, the input amplifier 670, the second pads 680, and the output amplifier 690 in FIG. 6A and FIG. 6B are similar to the components/functions having the same names in FIG. 3, FIG. 4, FIG. 5A, and FIG. 5B. Thus, details thereof are not repeated hereinafter.

Figure 7:
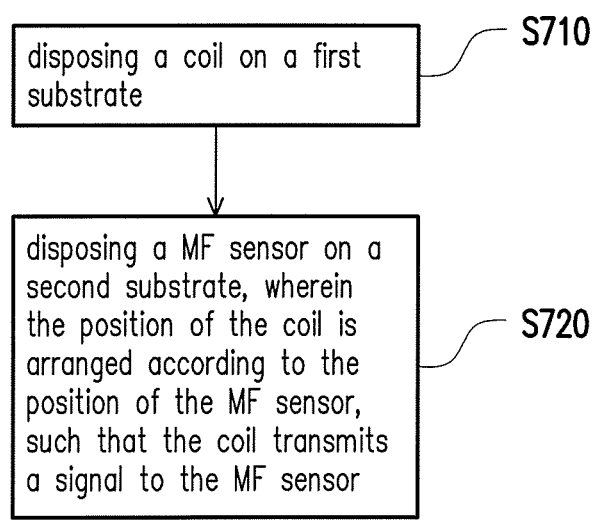
FIG. 7 is a flowchart showing a manufacturing method of an electrical isolator according to the first embodiment of the disclosure.

FIG. 7 is a flowchart showing a manufacturing method of an electrical isolator according to the first embodiment of the disclosure. With reference to FIG. 7, in Step S710, a coil is disposed on a first substrate. The first substrate has a first surface and a corresponding second surface. In Step S720, a MF sensor is disposed on a second substrate. The second substrate has a third surface and a corresponding fourth surface. The position of the coil is arranged according to the position of the MF sensor, such that the coil transmits a signal to the MF sensor. Details regarding the manufacturing method of the electrical isolator have been disclosed in the above embodiments. Nevertheless, it should be noted that the electrical isolator packaging structure in any of FIG. 3 to FIG. 6B may be implemented, as required, by performing a proper step.

To sum up, the electrical isolator packaging structure described in the embodiments of the disclosure utilizes the coil and the MF sensor (e.g., Hall sensor) to implement the functions of the electrical isolator by magnetic coupling. The electrical isolator in the embodiments of the disclosure may be combined with a chip manufacturing process, and the transmitted signal may be a high frequency signal or a low frequency signal and do not need to be modulated or demodulated. Accordingly, the electrical isolator implemented with the coil and the MF sensor in the embodiments of the disclosure lowers the power consumption and reduces signal distortion. Moreover, the electrical isolator packaging structure described in the embodiments of the disclosure does not need to be provided with modules for modulation/demodulation/noise filtering, and therefore the operating speed and stability of the circuit loop are enhanced correspondingly.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An electrical isolator packaging structure, comprising:
a first substrate;
a second substrate;
a coil disposed on the first substrate; and
a magnetic field (MF) sensor disposed on the second substrate,
wherein a position of the coil is arranged according to a position of the MF sensor, such that the coil transmits a signal to the MF sensor, and the first substrate is disposed above the second substrate, such that the position of the coil is right above the MF sensor.

2. The electrical isolator packaging structure according to claim 1, wherein the MF sensor is a Hall sensor.

3. The electrical isolator packaging structure according to claim 1, further comprising:
an input amplifier disposed on the first substrate,
wherein the input amplifier is connected to two ends of the coil.

4. The electrical isolator packaging structure according to claim 3, wherein the first substrate comprises a plurality of first pads, and the coil is electrically connected to the first pads via the input amplifier.

5. The electrical isolator packaging structure according to claim 4, further comprising:
an input stage circuit coupled to an input end of the input amplifier via a plurality of wires and the first pads, so as to transmit an input signal to the input amplifier.

6. The electrical isolator packaging structure according to claim 1, further comprising:
an output amplifier disposed on the second substrate,
wherein the output amplifier is connected to an output end of the MF sensor.

7. The electrical isolator packaging structure according to claim 6, wherein the second substrate comprises a plurality of second pads, and the MF sensor is electrically connected to the second pads via the output amplifier.

8. The electrical isolator packaging structure according to claim 7, further comprising:
an output stage circuit coupled to an output end of the output amplifier via a plurality of wires and the second pads, so as to receive an output signal of the output amplifier.

9. The electrical isolator packaging structure according to claim 8, further comprising:
a load coupled to the output end of the output stage circuit.

10. The electrical isolator packaging structure according to claim 1, further comprising:
a potential isolation layer disposed between the first substrate and the second substrate to isolate the first substrate and the second substrate,
wherein the first substrate and the second substrate are disposed on a chip.

11. An electrical isolator packaging structure, comprising:
a first substrate;
a second substrate;
a coil disposed on the first substrate;
a magnetic field (MF) sensor disposed on the second substrate, and
a potential isolation layer disposed between the first substrate and the second substrate to isolate the first substrate and the second substrate,
wherein a position of the coil is arranged according to a position of the MF sensor, such that the coil transmits a signal to the MF sensor, wherein the first substrate and the second substrate are disposed on a chip, the second substrate serves as a substrate of the chip, and the first substrate is disposed in the second substrate through the potential isolation layer.

12. An electrical isolator packaging structure, comprising:
a first substrate;
a second substrate;
a coil disposed on the first substrate;
a magnetic field (MF) sensor disposed on the second substrate, and
a potential isolation layer disposed between the first substrate and the second substrate to isolate the first substrate and the second substrate,
wherein a position of the coil is arranged according to a position of the MF sensor, such that the coil transmits a signal to the MF sensor, wherein the first substrate and the second substrate are disposed on a chip, the first substrate serves as a substrate of the chip, and the second substrate is disposed in the first substrate through the potential isolation layer.

13. The electrical isolator packaging structure according to claim 1, further comprising:
a third substrate; and
a control circuit disposed on the third substrate and electrically connected to a plurality of third pads in the third substrate,
wherein the coil is connected to a first pads of the first substrate, and the control circuit is electrically connected to the coil via the third pads in the third substrate and the first pads in the first substrate.

* * * * *